United States Patent [19]

Dey et al.

[11] Patent Number: 5,513,123
[45] Date of Patent: Apr. 30, 1996

[54] NON-SCAN DESIGN-FOR-TESTABILITY OF RT-LEVEL DATA PATHS

[75] Inventors: Sujit Dey; Miodrag Potkonjak, both of Plainsboro, N.J.

[73] Assignee: NEC USA, Inc., Princeton, N.J.

[21] Appl. No.: 268,823

[22] Filed: Jun. 30, 1994

[51] Int. Cl.$^6$ ........................................... G06F 17/50
[52] U.S. Cl. ..................... 364/489; 364/488; 364/490; 371/22
[58] Field of Search .................... 364/488, 489, 364/490, 491, 578; 371/22.3, 23, 25.1; 324/73 R, 158 R; 327/202

[56] References Cited

U.S. PATENT DOCUMENTS

| | | | |
|---|---|---|---|
| 4,588,944 | 5/1986 | Rothenberger | 324/73 R |
| 4,601,032 | 7/1986 | Robinson | 371/23 |
| 4,754,215 | 6/1988 | Kawai | 324/73 R |
| 5,043,986 | 8/1991 | Agrawal et al. | 371/25.1 |
| 5,072,178 | 12/1991 | Matsumoto | 324/158 R |
| 5,172,377 | 12/1992 | Robinson et al. | 371/22.3 |
| 5,329,533 | 7/1994 | Lin | 371/22.3 |
| 5,365,528 | 11/1994 | Agrawal et al. | 371/25.1 |
| 5,406,216 | 4/1995 | Millman et al. | 327/202 |
| 5,414,714 | 5/1995 | Gladden et al. | 371/22.3 |

OTHER PUBLICATIONS

Abhijit Ghosh, Srinivas Devadas and A. Richard Newton, "Sequential Test Generation and Synthesis for Testability at the Register–Transfer and Logic Levels", IEEE Transactions on Computer–Aided Design of Integrated Circuits and Systems, vol. 12, No. 5, May 1993, pp. 579–598.
Tushar Gheewala, "CrossCheck: A Cell Based VLSI Testablity Solution", in Proc. Design Automation Conference, Paper 41.1, pp. 706–709, 1989.
V. Chickermane et al, "Non–Scan Design-for-Testability Techniques for Sequential Circuits", in Proc. Design Automation Conference, pp. 236–241, Jun. 1993.
Tien–Chien Lee et al, "Behavioral Synthesis for Easy Testability in Data Path Allocation", Proc. of the Int'l Conf. on Computer Design 1992, pp. 29–32.
Tien–Chien Lee et al, "Behavorial Synthesis of Highly Testable Data Paths under the Non–Scan and Partial Scan Environments", proc. of Design Automation Conference, pp. 292–297, 1993.
Subhrajit Bhattacharya et al, "Transformations and Resynthesis for Testability of RT–Level Control–Data Path Specifications", in IEEE Trans. on VLSI Systems, vol. 1, No. 3, Sep. 1993, pp. 304–318.
Vivek Chickermane et al., "Design for Testability Using Architectural Descriptions", in Proc. of the Int'l Test Conf. Paper 35.3, pp. 752–761, Nov. 1992.
Vivek Chickermane et al, "A Comparative Study of Design for Testability Methods Using High–Level and Gate–Level Descriptions", Proc. of Int'l Conf. on Computer–Aided Design, pp. 620–624, Nov. 1992.
Johnannes Steensma et al, "Partial Scan at the Register-–Transfer Level", in Proc. Int'l Test Conf. 1993, pp. 488–497, Oct. 1993.
Haidar Harmanani et al, "An Improved Method for RTL Synthesis with Testability Tradeoffs", in Proc. of the Int'l Conf. on Computer–Aided Design, pp. 30–35, Nov. 1993.
Thomas Niermann et al, "HITEC: A Test Generation Package for Sequential Circuits", in Proc. EDAC, pp. 214–218, 1991.
D. H. Lee et al, "On Determining Scan Filp–Flops in Partial–Scan Designs", in Proc. IEEE 1990, pp. 322–325.
Susheel J. Chandra et al, "ATPG Based on a Noval Grid–Addressable Latch Element", Proc. IEEE Design Automation Conf. Paper 18.3, pp. 282–286. 1991.
Vivek Chickermane et al "An Optimization Based Approach to the Partial Scan Design Problem," 1990 Int'l Test Conference, Paper 19.2 pp. 377–386.

Primary Examiner—Kevin J. Teska
Assistant Examiner—Russell W. Frejd
Attorney, Agent, or Firm—Philip J. Feig

[57] ABSTRACT

Non-scan design-for-testability methods for making register-transfer-level data path circuits testable include using EXU S-graph representation of the circuits. Loops in the EXU S-graph are made k-level controllable/observable to render the circuit testable without having to scan any flip-flops or break loops directly. Moreover, the resultant circuit is testable at-speed.

14 Claims, 8 Drawing Sheets

NON-SCAN DESIGN-FOR-TESTABILITY OF RT-LEVEL DATA PATHS

FIELD OF THE INVENTION

The present invention concerns non-scan design-for-testability methods for making register-transfer level data path circuits testable. Loops in the data path are made k-level controllable and/or observable by using a novel EXU s-graph representation of the circuit. The result is a circuit testable without having to either scan any flip-flops or break loops directly.

BACKGROUND OF THE INVENTION

Among the several design-for-testability (DFT) methods which have been proposed to simplify the task of sequential test pattern generation, the partial scan method has become increasingly popular. Unlike full scan where all the flip-flops (FFs) in a circuit are made observable and controllable, the partial scan method selects a subset of FFs for scan. While it may be possible to achieve test efficiency comparable to that achieved by a full-scan circuit, a partial scan circuit usually requires less chip area and delay overheads, and shorter test application times due to the presence of fewer FFs in the scan chain.

However, the scan-based methods have a disadvantage that the test application time is very large compared to non-scan designs because the test vectors in the scan-based methods have to be shifted through the scan chain. Reduction of test application time has been addressed in several ways, e.g. arranging scan flip-flops in parallel scan chains and reconfiguring scan chains. In the parallel scan chain approach, the number of parallel scan chains, and hence the number of vectors that can be shifted in parallel, is limited by the minimum of the number of primary inputs and primary outputs of the circuit. The reconfigurable scan chain approach is limited by the ability of the circuit to be decomposed into a set of kernels, which are disjoint portions of logic that can be tested independently. Controllability and observability points are also provided in silicon-based solutions such as CrossCheck described in the article by T. Gheewala entitled "CrossCheck: A Cell Based VLSI Testability Solution" in Proc. DAC, pages 706 to 709, 1989 and in the article by S. J. Chandra et all entitled "ATPG Based on a Novel Grid-Addressable Latch Element" in Proc. DAC, pages 282 to 286, 1991. Test application is slow as a result of the need to scan observation and control points and the transmission delays along long diffusion lines used to select the observation and control points. On the other hand, non-scan DFT techniques do not require scanning of any FFs, thus eliminating the need to shift test vectors through scan chains and hence, greatly reducing the test application time.

However, the major disadvantage of scan-based DFT techniques is that the test vectors cannot be applied to the circuit at the operational speed of the circuit. That is, test vectors cannot be applied at consecutive clock cycles. The inability of scan designs to be tested "at-speed" assume significance in view of recent studies, which show that a stuck-at test set applied at-speed identifies more defective chips than a test set having the same fault coverage but applied at a lower speed. As a result of these studies, researchers began to investigate non-scan DFT techniques to make sequential circuits testable by introducing controllability and observability points. The leasability of non-scan DFT techniques to produce testable sequential circuits with high test efficiency was demonstrated in an article by V. Chickermane et al, entitled "Non-Scan Design-for-Testability Techniques for Sequential Circuits" in Proc. Design Automation Conf., pages 236 to 241, June 1993. The main advantage of the non-scan designs is that the test vectors can be applied at-speed.

Recently, several high level synthesis approaches have been proposed to generate easily testable data paths for both Built-In-Self-Test (BIST)-based testing methodology, and Automatic Test Pattern Generation (ATPG) methods. Test statement insertion has been used in the behavioral specification to improve testability of the circuit. An approach to generate testable data paths, by minimizing the number of self-loops, is known. Several techniques have been suggested to synthesize data paths without loops, by using proper scheduling and assignment, and scan registers to break loops.

Almost all BIST-based methods assume a scan design methodology since random testing is not well-suited for sequential circuits. Also, almost all the ATPG-based high level synthesis for testability approaches, with the exception of methods proposed in an article by T. C. Lee et al entitled "Behavior Synthesis for Easy Testability in Data Path Allocation" in the Proceedings of the Int'l Conf. on Computer Design 1992 and T. C. Lee et al, "Behavioral Synthesis of Highly Testable Data Paths under the Non-Scan add Partial Scan Environments" in the Proceedings of Design Automation Conference, pages 292 to 297, 1993 assume the rise of scan registers to make the data paths testable. However, the non-scan techniques presented in the Lee et al articles produce testable data paths only when the circuit designs have a large number of primary inputs (PIs) and primary outputs (POs), and do not have any loops. For instance, for the design example of a 5th order Elliptical Wave Filter, the Lee et al non-scan scheme could not make the data path testable. In general, most circuit designs have a small number of primary inputs and primary outputs. In addition, most circuits have several types of loops formed, partly due to the presence of such loops in the specification itself and partly due to resource sharing employed to generate area-efficient data paths. Consequently, the existing high-level testability techniques either are based on using scan methods or are not suitable for practical data paths having loops.

Several techniques have been developed to improve the testability of circuits by exploiting the RT-level (register transfer-level) description of designs. Transformation and optimization techniques were proposed in an article by S. Bhattacharya et al entitled "Transformations and Resynthesis for Testability of RT-Level Control-Data Path Specifications", in IEEE Trans. on VLSI Systems, 1 (3), pages 304 to 318, Sept. 1993 which utilize RT-level information to generate optimized designs that are 100% testable under full scan. Chickermane, Lee, and Patel in two articles entitled "Design for Testability Using Architectural Descriptions" in Proc. of the Intl Test conf. pages 752 to 761, Nov. 1992 and entitled "A Comparative Study of Design for Testability Methods Using High-Level and Gate-Level Descriptions" in Proc. of the Intl Conf on Computer-Aided Design, pages 620 to 624, Nov. 1992, showed that the use of RT-level information to select scan flip-flops results in significantly better performance when compared to techniques limited to gate-level information only. Steensma, Catthoor, and De Man in an article entitled "Partial Scan at the Register-Transfer Level" in Proc. ITC pages 488 to 497, Oct, 1993, proposed an efficient partial scan methodology applicable to data paths described at the RT-level. The method is based on eliminating loops by making existing registers scannable, or by adding extra transparent scan registers. In an article by H. Harmanani et al entitled "An improved Method for RTL Synthesis with Testability Tradeoffs" in Proc. of the Intl Conf on Computer-Aided Design, pages 30 to 35, Nov. 1993, an RT-level method was presented to generate vvself-testable RTL data paths, using allocation and automatic test point selection to reduce the sequential depth from controllable to observable registers. Like the high-level synthesis for testability techniques summarized above, all the existing RT-level techniques are scan-based, and cannot generate testable data paths without the use of scan.

It is known that the dependencies of the flip flops (FFs) of a sequential circuit may be captured by an S-graph. It has been empirically determined that sequential test generation complexity may grow exponentially with the length of the cycles in the S-graph. An effective partial scan approach selects scan flip flops in the minimum feedback vertex set (MFVS) of the S-graph, so that all loops, except self-loops, are broken, and the sequential depth is minimal. Existing non-scan techniques also restrict themselves to flip flops as the nodes to be made controllable. The non-scan technique presented in Chickermane et al supra selects flip flops to load from primary inputs (add control point) such that the loops in the circuit are broken.

Breaking all the cycles in a circuit by scan flip flops may be very expensive in terms of the scan overhead, especially for data paths which have a tendency to have complex loop structures. Also, the presence of a large number of flip flops in the scan chain increases the test application time. For non-scan designs, effective controllability of flip flops is limited by the number of primary inputs available.

SUMMARY OF THE INVENTION

In accordance with the teachings of the present invention, these limitations are overcome by a novel DFT methods which permits data path testing without using scan registers. The register transfer level structure of data paths is used to introduce the EXU S-graph, which captures the dependencies between the execution units (EXUs) of the data path. The choice of EXUs (their outputs) as the nodes to be made controllable/observable is more effective than the choice of FFs (registers at the RT-level) used by traditional scan and non-scan DFT techniques since the MFVS of the EXU S-graph is a lower bound to the MFVS of the S-graph of its registers. In contrast to making the same node controllable and observable (as in scan approaches), a more cost-effective distributed approach is used where some nodes are made controllable, while some other nodes are made observable.

The present invention is a design-for-testability (DFT) method for making RT-level data paths testable. Prior DFT methods for data paths generally relied on scan or partial scan methods. The present invention is a non-scan design which results in a design which can be tested at speed, thus enhancing the probability of detecting defective clips. The effectiveness of the DFT method is a result of a novel testability measure which eliminates the need to explicitly break loops in the data path. The result is a design exhibiting high test efficiency without using scan and with significantly lower test area overhead and test application time than corresponding partial scan designs.

The prior art method of breaking all the loops is not necessary to make a circuit testable. The present invention concerns a testability measure based on k-level controllability and observability of loops. It suffices to make loops k-level controllable/observable, instead of directly breaking them, to make the data paths highly testable. RT-level based non-scan DFT techniques are used e.g., adding constants and dual points, in order to make all loops in the data path k-level controllable/observable. The RT-level structure of the data path, and the k-level measure, are used for cost-effective redesign of the circuit to make the circuit easily testable, without having to either scan any flip flop, or break loops directly.

The advantages of the DFT approach at the RT-level are numerous. For example, the complexity of the EXU S-graph is significantly lower than that of the FF S-graph. Moreover, knowledge of the RT-level structure as well as the functions of the RT-level components are utilized to develop new cost-effective non-scan DFT methods. Controllability/observability points can be implemented using register files and constants, and large cliques of size k of FFs can be broken by choosing a single control/observe point, instead of having to control/observe k-1 FFs. Knowledge of the formation of loops is utilized for the distributed non-scan approach, to minimize the test overhead. Finally, novel algorithms enable the addition of the minimal hardware necessary to make all loops in the data path k-level controllable/observable using the RT-level information, for both the distributed and dual points methods.

The invention has most benefit for computation-intensive application domains, e.g., DSP, communications, control theory applications, and graphics, where only a few FFs are needed for the states of the controller. In this novel design for testability framework, all the control signals to the data path are assumed to be made fully controllable by loading the FFs of the controller with primary input signals, e.g. using the technique outlined in Chickermane et al supra. It is further assumed that the underlying hardware model used is a dedicated register file model. This model assumes that all registers are grouped in a certain number of register files (each register file contains one or more registers) and that each register file can send data to exactly one execution unit. At the same time each execution unit can send data to an arbitrary number of registers files. This model is not only used in a number of high level synthesis systems, but also in many manual ASIC and general purpose datapaths. Although the present invention is described in conjunction with the dedicated register file model, it will be apparent to those skilled in the art that the non-scan DFT methods can be easily modified to be applicable to any arbitrary hardware model.

The primary advantages of the present invention is the ability to perform at-speed testing. In addition, the hardware overhead and the test application time required for the non-scan designs are significantly lower than that of the partial scan designs.

Using the concept of k-level controllable and observable loops, if all the loops are made k-level controllable/observable, and k>0, very high test efficiency can be achieved. The testability measure eliminates the need of traditional DFT techniques to make all loops directly (0-level) controllable/observable, therefore reducing significantly the hardware overhead requirement, thus rendering the non-scan DFT method feasible and effective.

The present invention also provides for the use of dual points which utilize the different controllability/observability levels of loop in order to make one loop controllable while making another loop observable. In addition, novel algorithms result in the addition of the minimal hardware necessary to render all loops in the data path k-level controllable/observable without using scan FFs.

The present invention will become more clearly apparent when the following description is read in conjunction with the accompanying drawing.

DETAILED DESCRIPTION OF THE INVENTION

Figure 1A:
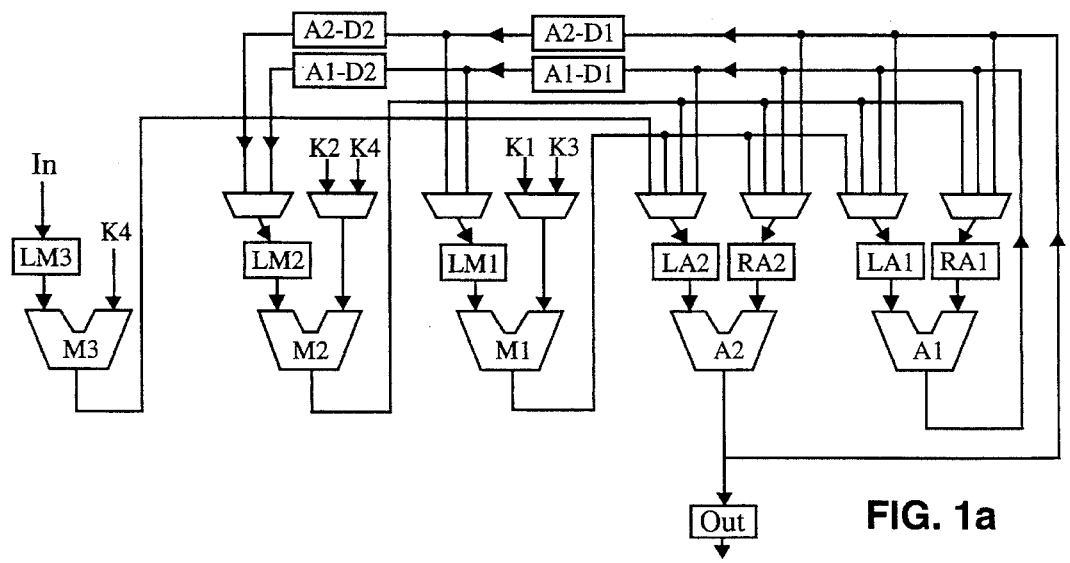
FIG. 1a is a register-transfer (RT) level data path diagram for a 4th order IIR cascade filter.

Referring now to the figures, and to FIG. 1(a) in particular, there is shown the register-transfer (RT) level data path for a 4th order IIR cascade filter, synthesized from behavioral description using the HYPER high-level synthesis system. In describing the present invention, the 4th order IIR cascade filter will be used as an illustrative example of a circuit lot applying the invention. The basic RT-level components of a typical data path are execution units (e.g. adders, multipliers, ALUs, transfer units), registers, multiplexors, and interconnects. The data path shown in FIG. 1(a) has two adders (A1, A2), three multipliers (M1, M2, M3), twelve multiplexors (trapezoidal boxes) and twelve registers (rectangular boxes), as shown by row 4IIRcas in Table 1. There are several transfer units which are used to transfer data produced in one iteration to a clock cycle in a subsequent iteration. The transfer units comprise registers and multiplexors.

TABLE 1

Characteristics of the RT-Level Data Paths

| Design | Bits | Add | Mult | Reg | Mux | Inter | Area (Cells) |
|---|---|---|---|---|---|---|---|
| 4IIRcas | 20 | 2 | 3 | 12 | 12 | 20 | 7486 |
| Speech | 20 | 2 | 3 | 12 | 9 | 9 | 6022 |
| EWF | 16 | 3 | 3 | 23 | 29 | 20 | 6968 |
| EWFhigh | 20 | 1 | 1 | 18 | 23 | 6 | 7538 |
| 4IIRpar | 20 | 6 | 6 | 23 | 0 | 23 | 9757 |

Figure 1B:
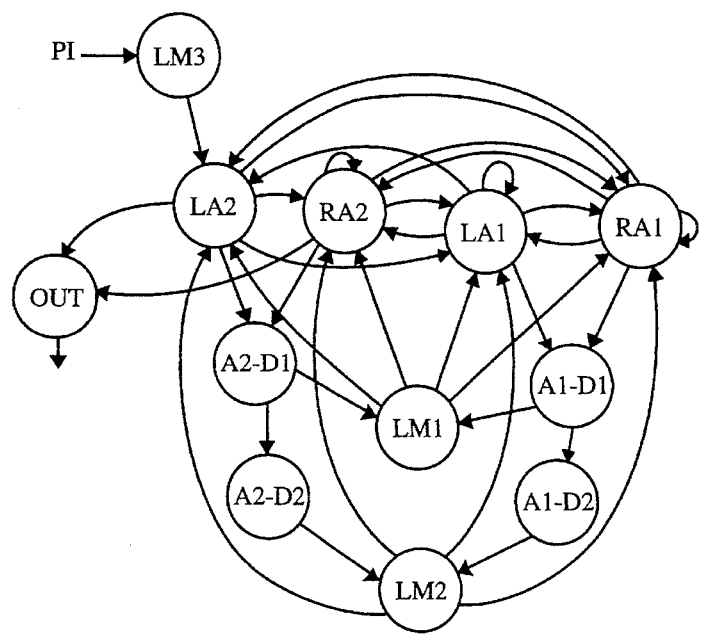
FIG. 1b is a register S-graph of the 4th order IIR cascade filter.

Similar to the S-graph of a gate-level sequential circuit, the S-graph of a data path identifies the dependencies between the registers of the data path. The register S-graph in FIG. 1(b), corresponding to the data path shown in FIG. 1(a), shows the existence of several loops involving the registers of the data path. Sequential ATPG is very difficult for the illustrated data path, as indicated in Table 2 by the row Orig.

TABLE 2

4IIRcas: Cost and Effect of several DFT schemes

| Type | Test Hardware | Overhead (Cells) | Faults Total | Abt | FC % | TE % | Vec | Tgen (secs) | Tappl (cycles) |
|---|---|---|---|---|---|---|---|---|---|
| Orig | None | 0 | 10004 | 9667 | 0.00 | 3.00 | — | 23884 | -NA- |
| Partial-Scan DFT | | | | | | | | | |
| Opus | 60 scan FFs | 665 | 10004 | 3 | 96.86 | 99.97 | 156 | 226 | 9516 |
| LR | 60 scan FFs | 665 | 10004 | 3 | 96.87 | 99.97 | 168 | 210 | 10080 |
| Non-Scan DFT | | | | | | | | | |
| 2-lev | 2c | 120 | 10086 | 239 | 94.49 | 97.63 | 109 | 6982 | 109 |

TABLE 2-continued

4IIRcas: Cost and Effect of several DFT schemes

| Type | Test Hardware | Overhead (Cells) | Faults Total | Abt | FC % | TE % | Vec | Tgen (secs) | Tappl (cycles) |
|---|---|---|---|---|---|---|---|---|---|
| | 123 | | | | | | | | |
| 1-lev | 1c, 1cp, 1op | 349 | 10334 | 70 | 96.17 | 99.32 | 149 | 686 | 149 |
| 0-lev | 2cp, 1op | 429 | 10448 | 5 | 96.95 | 99.95 | 268 | 292 | 268 |

The testability of the data path can be improved by using partial scan techniques to break all the loops of the circuit. The minimum feedback vertex set (MFVS) is the minimum number of vertices required to be deleted so that all loops, except self-loops, are broken. Since the MFVS of the S-graph shown in FIG. 1($b$) is 3, breaking all the loops requires scanning at least three registers, namely LA1, LA2, and LM1. For the 20-bit IIR filter data path shown in FIG. 1($a$), 60 scan FFs are needed by the gate-level partial scan tool OPUS described in the article by V. Chickermane et al entitled "An Optimization Based Approach with Partial Scan Design Problem" in Proc. of the Int'l Test Conf, pp. 337 to 386, September 1990, and Lee-Reddy's partial scan tool shown by the rows Opus and LR respectively in Table 2. The sequential ATPG program HITEC described by T. M. Niermann et al in an article entitled "HITEC: A Test Generation Package for Sequential Circuits" in Proc EDAC, pages 214 to 218, 1991 can achieve 100% test efficiency on the scan designs, requiring 156 test vectors for the Opus design. Besides the high area overhead, the scan designs have high test application time, indicated by the column Tappl in Table 2. For instance, the Opus design requires $156*(60+1)=9516$ clock cycles to apply all the 156 test vectors. Most importantly, the scan designs cannot be tested at-speed.

It is not necessary for a non-scan DFT method to be restricted to only registers in the selection of nodes to break, that is, to make controllable/observable. As opposed to making the same point controllable as well as observable, it may be more cost-effective to make some points controllable, while making some other points observable. An EXU S-graph shows that in a data path (the output of) EXUs are better choices for controllable/observable points than registers. Each node in the EXU S-graph represents an EXU in the data path. There is a directed edge from node u to node v, labelled i, and denoted $$u \xrightarrow{i} v,$$

if there exists a direct path from EXU u to the ith register file of EXU v, without going through any other register.

The EXU S-graph for the data path shown in FIG. 1($a$) is shown in FIG. 1($c$). In the data path of FIG. 1($a$), there is a direct path from the multiplier M3 to the left (1st) register file LA2 of adder A2; represented by the edge $$M3 \xrightarrow{1} A2$$

in the EXU S-graph shown in FIG. 1($c$). Similarly, M1 sends data to both the first LA2 and second RA2 register files of A2, represented by the edges $$M1 \xrightarrow{1} A2 \text{ and } M1 \xrightarrow{2} A2$$

in the EXU S-graph. (Without loss of generality, it is assumed that the left and right register files of an EXU are numbered 1 and 2 respectively.) Note that for ease of illustration, instead of showing k separate edges with k different labels from a node u to node v, a single edge having all the k labels is shown.

The EXU S-graph shown in FIG. 1($c$) has several loops, similar to the register S-graph shown in FIG. 1($b$). There are two loops in the EXU S-graph between M1, A2 and D1, namely $$M1 \xrightarrow{1} A2 \xrightarrow{1} D1 \xrightarrow{1} M1, \text{ and}$$

$$M1 \xrightarrow{2} A2 \xrightarrow{1} D1 \xrightarrow{1} M1.$$

However, all the loops in the EXU S-graph pass through the two EXUs, A1 and A2. Hence, the MFVS of the EXU S-graph is 2, as opposed to an MFVS of 3 for the register S-graph of FIG. 1($b$). In general, the MFVS of an EXU S-graph is a lower bound of the MFVS of the Register S-graph, making EXUs better candidates for being controllable/observable than registers which in previous methods were made controllable/observable.

A node can be made controllable/observable in several ways. Two preferred schemes, which do not use scan registers, and which will be applicable to data paths at the RT-level will be described. The first method is a direct non-scan method and the second method is register-file based non-scan method. FIG. 2($a$) shows an EXU, A2, and its register files, used in the EWF data path reported in Table 3.

TABLE 3

EWF: Cost and Effect of several DFT schemes

| Type | Test Hardware | Overhead (Cells) | Faults Total | Abt | FC % | TE % | Vec | Tgen (secs) | Tappl (cycles) |
|---|---|---|---|---|---|---|---|---|---|
| Orig Partial-Scan DFT | None | 0 | 9088 | 8879 | 0.00 | 2.00 | — | 27423 | -NA- |
| Opus | 240 scan FFs | 2645 | 9088 | 0 | 97.99 | 100.00 | 118 | 209 | 28320 |
| LR Non-Scan DFT | 240 scan FFs | 2645 | 9088 | 9 | 97.89 | 99.90 | 137 | 223 | 32880 |
| 3-lev | 3c | 96 | 9186 | 4180 | 52.50 | 54.43 | 52 | 18043 | 52 |
| 2-lev | 1c, 1cp, 1op | 256 | 9380 | 891 | 88.85 | 90.50 | 72 | 4668 | 72 |
| 1-lev | 1cp, 1op | 224 | 9346 | 178 | 96.14 | 98.09 | 253 | 985 | 253 |
| 0-lev | 3cp, 3op (2ntest pins) | 671 | 9798 | 296 | 95.10 | 96.97 | 278 | 1222 | 278 |

Figure 2A:
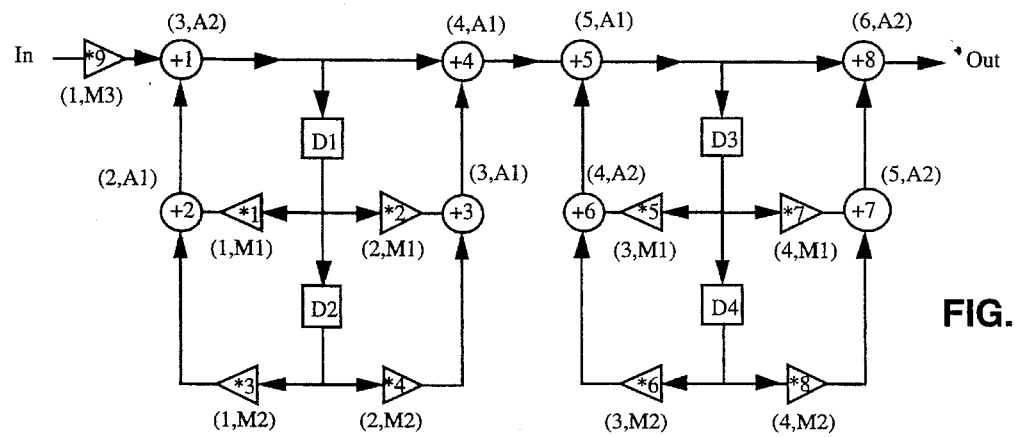
FIG. 2a is a register-transfer level data path diagram of an EXU and its register files.
Figure 2B:
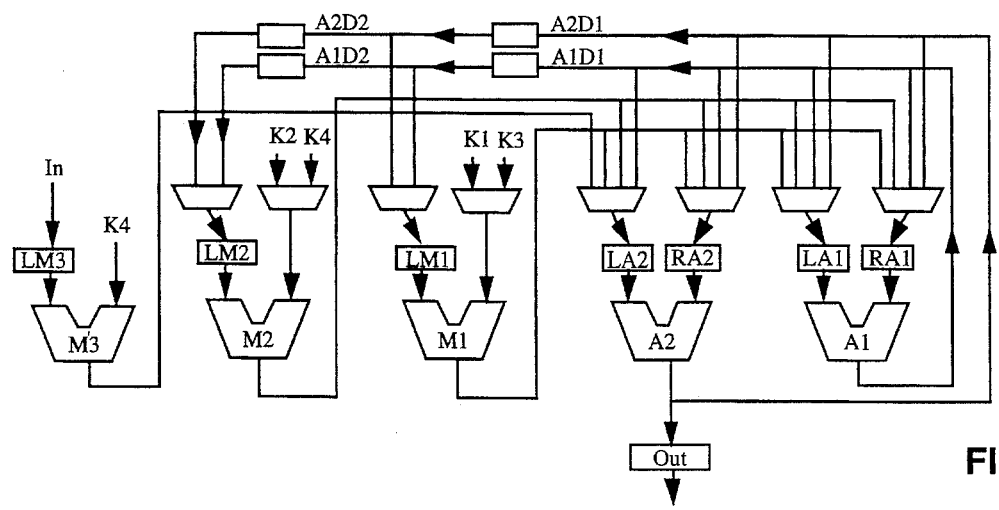
FIG. 2b is a register-transfer level data path diagram of a direct non-scan method of incorporating controllability/observability into the design.

In accordance with the direct non-scan method, the output of A2 can be made controllable by adding an interconnect from a PI to a multiplexor placed at the output of A2, as shown in FIG. 2(b). The multiplexor is controlled by a test pin, ntest, which is set to "0" during the normal operation of the data path, and can be set to any value required during the test mode. Hence, the output of the mux A2, Z, remains unchanged to be the output of A2 during the normal operation of the data path, while it can be set to the value of the PI during the test mode, making the point Z directly controllable.

Similarly, the output of A2 can be made observable by adding an observability point (probe point) from A2, and multiplexed with the PO, also as shown in FIG. 2(b). The mux is controlled by the test point ntest, which is operated similar to the control point multiplexor, ensuring the functionality of the data path remains unchanged. Note that the number of probe points that can be added is limited by the number of POs of the circuit, unless multiple test pins are added. Also, at any clock cycle, either the probe point or the PO, but not both, is observable at PO', the new output.

Figure 2C:
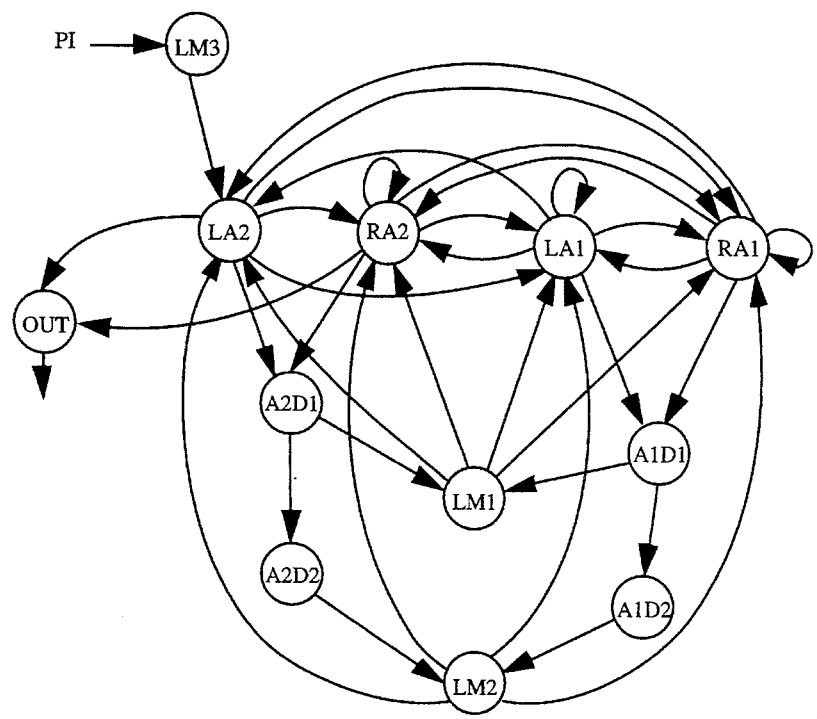
FIG. 2c is a register-transfer level data path design of a register file based non-scan method of incorporating controllability/observability into the design.

In accordance with the register-file based non-scan method, instead of adding the controllability point to the output of EXU, controllability points are added to the register files associated with inputs of the EXU. In this case, it suffices to make only one register of each register file of the EXU controllable. FIG. 2(c) shows a preferred arrangement where register L2 of the left register file is made controllable by adding the control point from PI. Register R4 is made controllable by adding a constant (say the identity element of the operation performed by the EXU, in this case 0). Any value at the output of A2 call be justified by setting proper value at the PI. The register-file based scheme is advantageous if one of the register files already has a controlled register, or in the context of k-level controllability (described below).

Register files often have self-loop registers, that is a register which receives data from the same EXU to which it sends data. For example, registers L1, L2, R1, R3 and R4 are self-loop registers in FIG. 2(a). A register file containing m self-loop registers forms a clique, termed register file clique, of size m in the register S-graph and hence needs m-1 scan registers to break all the loops in the clique, that is, to make all the registers controllable. In data paths using high hardware sharing, the register files contain a large number of self-loop registers, forming large register the cliques, which become a problem for scan-based DFT techniques.

However, once the output of the EXU has been made controllable using one of the non-scan DFT methods described above, each register of the associated register files can be controlled to any desired value in at most two clock cycles (time frames). For example, any register in the register files in FIG. 2(c) is now controllable in at most two clock cycles. Consequently, the expensive DFT solution of having to scan four self-loop registers is eliminated.

Figure 1C:
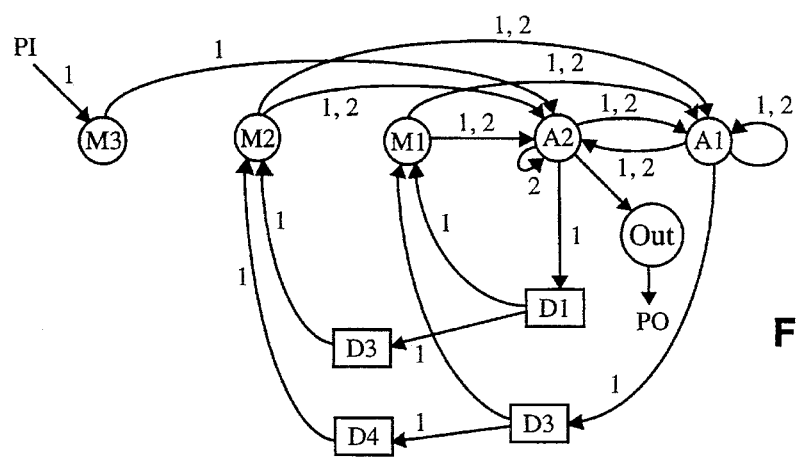
FIG. 1c is an EXU S-graph of the 4th order IIR cascade filter.

Having described two methods by which nodes (outputs of EXUs) can be made controllable/observable, these methods will be applied to the task of non-scan DFT of the data-path of the 4th order IIR cascade filter, shown in FIG. 1(a). The MFVS of the EXU S-graph of the datapath, shown in FIG. 1(c), is A1 and A2. Hence, making the outputs of A1 and A2 controllable/observable breaks all the loops directly, that is, makes all the loops 0-level controllable/observable. That is, any value at the outputs of A1, A2 can be controlled and observed in one clock cycle (time frame). Compared to the register S-graph solution, which requires making three registers controllable/observable, the direct non-scan method is preferable. However, a further alternative, much less expensive non-scan DFT technique will be described which also makes the data path testable.

Figure 3A:
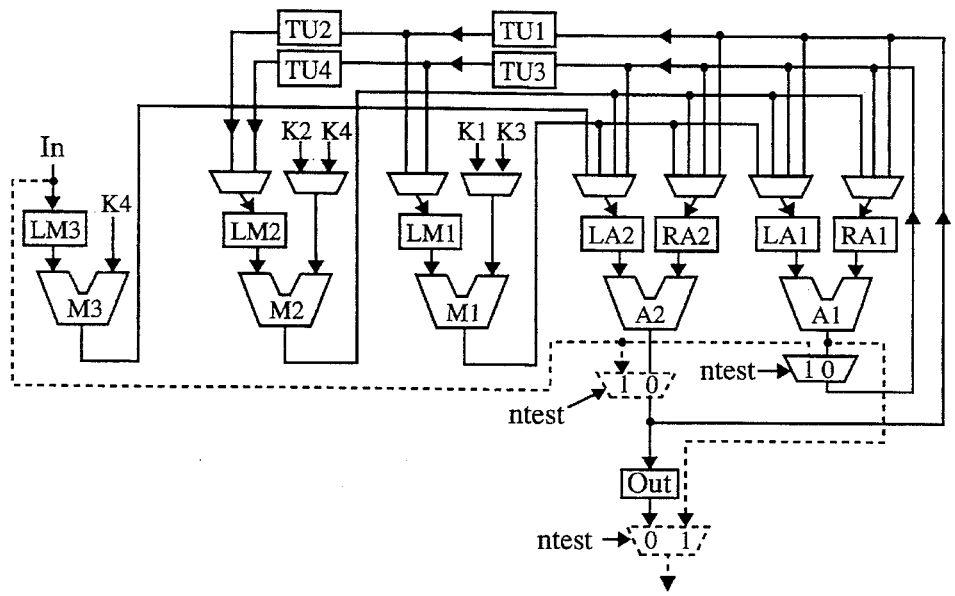
FIG. 3a is a register-transfer level data path diagram of a non-scan DFT of the 0-level testable data path shown in FIG. 1(a)

The EXU S-graph in FIG. 1(c) reveals that all loops through A2 are observable, since A2 goes directly to the PO Out. Hence, all that is needed is a controllability point added to the output of A2, while both a controllability and observability point is added to the output of A1. FIG. 3(a) shows the modified data path for 0-level testable data path where all loops are 0-level controllable/observable of the circuit shown in FIG. 1(a), with test hardware added (shown with the signal ntest) to insert one controllability point at the output of A1 and A2, and one observability point from the output of A2. A test efficiency of 100% is achievable on the resultant data path, as evidenced by the row 0-lev in Table 2. The test hardware overhead required for the modified data path is 429 cells, (5.7% of the original data path), which is less than the overhead of 665 cells needed for the scan designs (rows Opus, LR in Table 2). Besides having the main advantage of at-speed testing, the number of clock cycles required for test application (column Tappl) for the non-scan design is much less than the scan design. However, the main advantage of the non-scan design shown in FIG. 3(a) over the scan designs is the ability of at-speed testing.

Figure 3B:
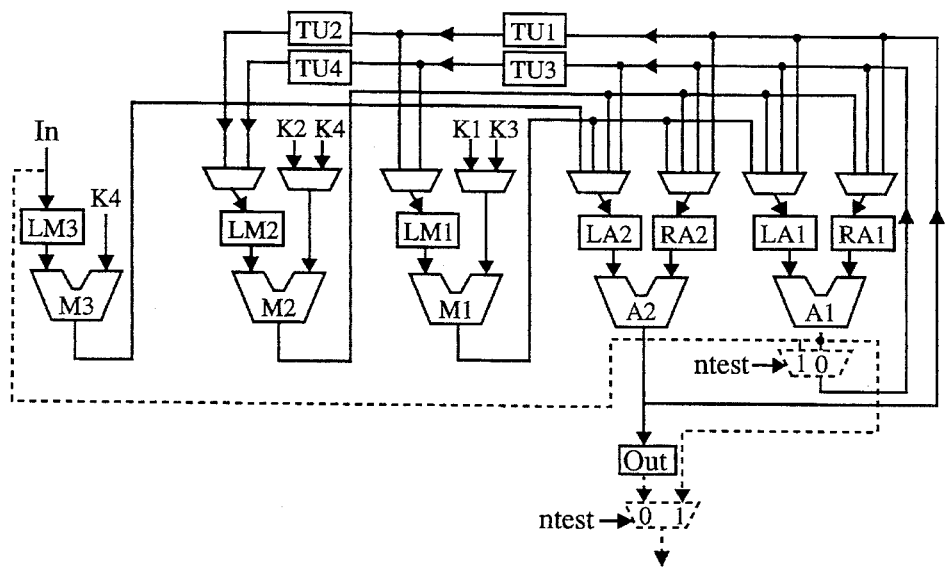
FIG. 3b is a register-transfer level data path diagram of a non-scan DFT of a 1-level testable data path of the data path shown in FIG. 1(a)

It is not necessary to make the loops of the data path directly (0-level) controllable/observable. FIG. 3(b) shows an alternative testable design, with the non-scan test hardware shown with input ntest. Instead of adding a controllability point to the output of A2, only a constant ("0", the identity element of addition) is added to the right register file (RA2) of A2. Any value at the output of A2 can still be justified by at most two time frames. For example, if a value of 9 needs to be justified at the output of A2, in one time frame the registers LA2 and RA2 can be set to appropriate values 9 and 0. and in the next time frame the values of LA2 and RA2 can be justified by In and the constant. Adding the constant requires much less hardware overhead than adding a controllability point at the output of A2, since the multiplexer logic associated with the constant signals can be pruned. Note that the non-scan design in FIG. 3(b) makes use of the register-file based method described above. The loops through A2 are now 1-level controllable. The resultant (1-level controllable/observable) data path shown in FIG. 3(b) requires much less hardware overhead than the 0-level solution shown in FIG. 3(a). Also, a very high test efficiency of 98% is achievable on the resultant data path, as evidenced by the row 1-lev in Table 2.

Figure 3C:
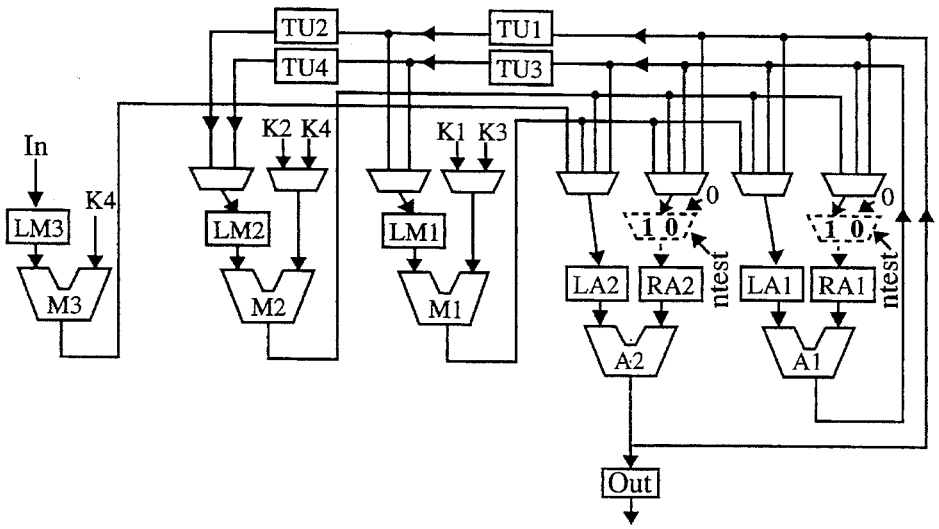
FIG. 3c is a register-transfer level data path diagram of a non-scan DFT of a 2-level testable data path of the data path shown in FIG. 1(a)

The data path in FIG. 3(c) demonstrates more effectively the benefits of non-scan DFT at the RT-level, and the concept of k-level controllable/observable loops. The data path shows the addition of constants to the right registers, RA1 and RA2, of the EXUs A1 and A2, respectively. As will be explained below, all the loops in the EXU S-graph now become 2-level or less controllable/observable. The test hardware required is significantly less than that required in both the 0-level and 1-level testable data paths shown in FIGS. 3(a) and 3(b) respectively, and as shown in row 2-lev in Table 2. The area overhead is only 120 cells, as compared to an overhead of 665 cells for the scan design, 429 cells for the 0-level non-scan design, and 349 cells for the 1-level non-scan design. The 2-level testable design, however, has a very high test efficiency of 98%, comparable with the test efficiency achieved by the more expensive scan designs, the 0-level and 1-level non-scan designs.

The non-scan designs and their high test efficiency results demonstrate the feasibility of using the non-scan DFT methods. Moreover, the highly testable non-scan designs shown in FIGS. 3(b) and 3(c) establishes the methods of making loops k-level controllable/observable as a viable, efficient, and cost-effective alternative to the traditional DFT technique of breaking all loops directly, that is making the loops 0-level controllable/observable.

The output of A1 is 2-level observable, since any value at the output of A1 can be propagated out in three clock cycles in the following way. In the first clock cycle, A1 can be propagated to LA2. Since RA2 can be independently controlled to the constant (here 0), in the next clock cycle, LA2 can be propagated to the output of A2, and hence register Out. In the third clock cycle, register Out can be directly observed at the PO. Consequently, the output of A1 is made 2-level observable.

Figure 4A:
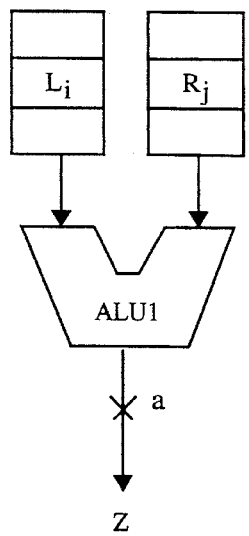
FIG. 4a is a register-transfer level data path diagram of an EXU and its register files.
Figure 4B:
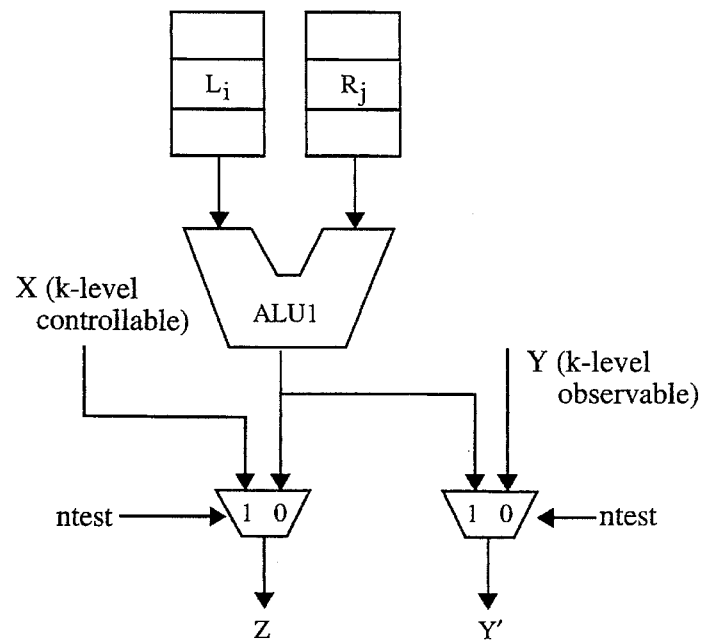
FIG. 4b is a register-transfer level data path diagram of a k-level controllable/observable ALU designed in accordance with the direct method.

In general, the output of an EXU, Z, can be made k-level controllable/observable either by the direct method or by the register-file based method. In accordance with the direct method, the EXIT output is directly muxed with a k-level controllable node to make Z k-level controllable. The EXU output is made k-level observable by directly muxing it with another node which is k-level observable. Referring to the EXU (ALU1) shown in FIG. 4(a), in FIG. 4(b) there is shown ALU1 made k-level controllable and observable using the direct method described above by the addition of one multiplexor for k-level controllability and a second multiplexor at the output for k-level observability.

Figure 4C:
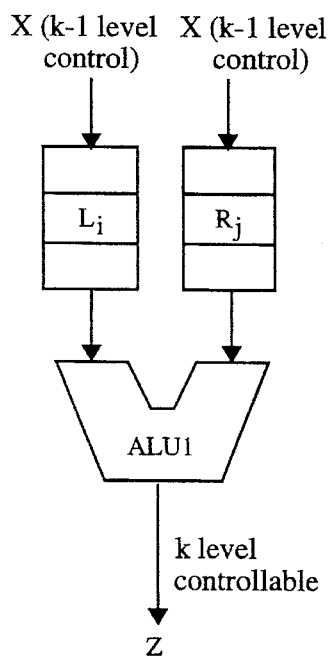
FIG. 4c is a register-transfer level data path diagram of a k-level controllable ALU designed in accordance with the; register file based method.
Figure 4D:
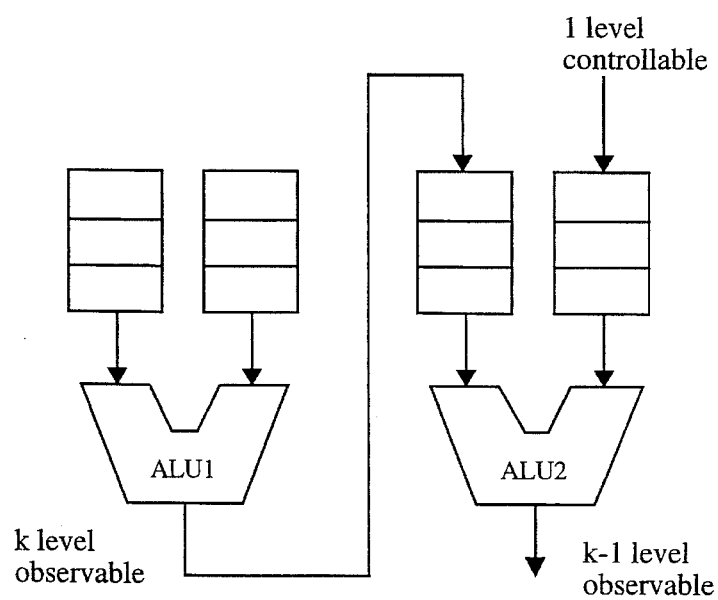
FIG. 4d is a register-transfer level data path diagram of a k-level observable ALU designed in accordance with the register file based method.

In the register-file based method, an EXU (output) is k-level controllable if at least one register of each register file of the EXU has a k-1 level controllable input. FIG. 4(c) illustrates such an arrangement where a files is k-1 level controllable. An EXU is k-level observable if it has an interconnect to a register file of another EXU (ALU2), which is k-1 level observable, and whose other register file has a 1-level controllable input. FIG. 4(d) shows how ALU1 is made k-level observable accordingly.

In order to add testability hardware to make nodes k-level controllable/observable, for a user-specified k, it is necessary to calculate the controllability/observability levels of nodes. The controllability level of a node X is denoted as clevel(X). That is, clevel(X)=k indicates that node X is k-level controllable. Also, RF(M) denotes the set of register files of EXU M, and out(M) denotes the output bus of EXU M. Then, the controllability level of an EXU M is:

$$\text{clevel}(M) = \begin{cases} k & \text{out}(M) \text{ muxed with } X, \text{clevel}(X) = k \\ \max_{R \in RF(M)} \{\min_{i \text{ an input to } R}(\text{clevel}(i)) + 1\} & \text{otherwise} \end{cases}$$

An EXU M is k-level controllable/observable if any value on the output of M can be justified/propagated in at most k+1 clock cycles (time frames). Alternatively, for any value that needs to be justified at the output of M, there exists at least one vector sequence of length at most k+1 that justifies the value.

Consider the data path shown in FIG. 3(c). The output of A1 is 2-level controllable, as explained below. For example, to justify a value of 15 at the output of A1, in the first time frame LA1 can be set to 15, and RA1 to 0. In the second time frame, the value of RA1 can be immediately justified by the constant. To justify the value of LA1, which is the output of A2, the input registers of A2, LA2 and RA2, are set to 15 and 0 respectively. In the third time frame, RA2 can be justified because of the presence of the constant to RA2. Suppose the constant K4 applied to M3 is 1. LA2 can be justified by setting In to 15. Similarly, any value at the output of A1 can be justified in three time frames, making A1 2-level controllable. Without the addition of the constants, the output of A1 is not controllable, as is in the original data path of FIG. 3(a).

Similarly, the observability level can be, calculated using the direct and register-file based methods of making a node k-level observable, as described above.

Assume clevel(A1)= 1, clevel(A3)= 3, and clevel(M2)= 2 in the EXU shown in FIG. 2(a). In that case, clevel(A2)= max{1,1}+1=2. FIG. 2(c) shows the non-scan DFT, using the register-file based method, to make clevel(A2)=1.

A loop is k-level controllable if there is at least one node in the loop which is k-level controllable. A loop is k-level observable if there is at least one node in the loop which is k-level observable. A data path is k-level testable if all loops in the data path are k-level or less controllable and observable.

Referring to the data path shown in FIG. 3(c) which was derived from the data path in FIG. 1(a), by adding two constants ("0") to the right registers, RA2 and RA1, of the EXUs A2 and A1 respectively. All loops going though A1 are 2-level controllable and 2-level observable since A1 is 2-level controllable/observable. Similarly, all loops going through A2 are 1-level controllable/observable. Hence, the data path shown in FIG. 3(c) is 2-level testable.

Note that to make the data path in FIG. 1(a) 0-level testable, two controllability points and one observability point need to be inserted, as shown in FIG. 3(a). Alternatively, to make the data path 2-level testable, only two constants need to be added, as shown in FIG. 3(c). As shown in Table 2, the test area overhead of the resultant 2-level testable data path (120 cells) is significantly smaller than the overhead of the 0-level testable data path (429 cells). Because of its very low test hardware overhead (1.6%), and high test efficiency (98%), the 2-level testable design is a cost-effective alternative to the more expensive 0-level testable design and the much more expensive scan designs as shown in Table 2.

In the description above, the same node was always selected (output of EXU) to simultaneously make the design k-level controllable/observable. However, a loop L1 may be more controllable (have a node with lower controllability level) than some other loop L2 in the original data path, even though loop L2 may be more observable than loop L1 in the original data path. Instead of adding simultaneously controllability points (cp) and observability points (op) to selected nodes on both L1 and L2, it may be more economical to add an observability point to L1 and a controllability point to L2.

Figure 5A:
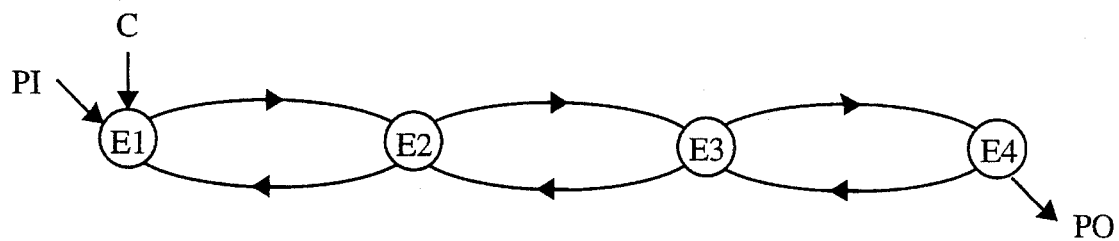
FIG. 5a is an EXU S-graph of an original data path.
Figure 5B:
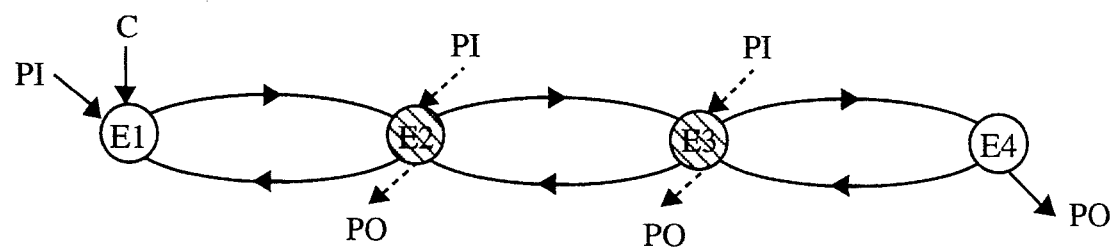
FIG. 5b is an EXU S-graph using two controllability points and two observability points.

Consider an EXU S-graph as shown in FIG. 5(a). In order to make all loops 1-level controllable/observable, that is, produce a 1-level testable design, if the same nodes are selected for adding both controllability and observability points simultaneously, the result is a lumped solution as in FIG. 5(b). The nodes E2 and E3 are selected. A broken arrow from PI indicates the addition of a controllability point from a PI. Similarly, a broken arrow to a PO indicates the addition of an observability point. After the addition of the two controllability points and two observability points, all the loops in the data path are 0-level controllable/observable, thus making the modified data path 0-level testable.

However, the loop E1→E2→E1 is already 1-level controllable in the original data path shown in FIG. 5(a) since node E1 is 1-level controllable. Similarly, the loop E3→E4→E3 is 1-level observable in the original data path since node E4 is 1-level observable. Instead of attempting to make the loops controllable/observable simultaneously, it may be more cost-effective to first add observability points to make all loops observable, and then add controllability points to make all loops controllable. In this manner, the controllability/observability points will be added in a distributed manner, and a lesser number of points will suffice to make the design k-level testable.

Figure 5C:
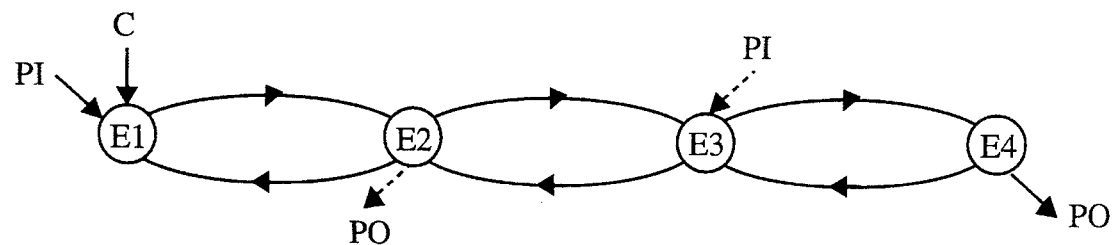
FIG. 5c is an EXU S-graph using one controllability point and one observability point.

For the example shown in FIG. 5(a), it would suffice to make the loops E1→E2→E1 and E2→E3→E2 1-level observable, which can be achieved by just adding one observability point to E2. Also, it would suffice to make the loops E2→E3→ E2 and E3→E4→E3 1-level controllable, which can be achieved by a single controllability point added to E3. The resultant distributed solution, shown in FIG. 5(c), uses only one cp and one op, and hence is more economical than the lumped solution shown in FIG. 5(b), which uses two cp and two op.

Dual points is another powerful technique to optimize non-scan test hardware. A controllability point primarily enhances the controllability of a loop. An observability point primarily enhances the observability of a loop. However, a dual point is used for the dual purpose of enhancing the controllability of one loop, while enhancing the observability of another loop. The following example illustrates the dual point technique and its advantages.

Assume that a loop L1 is $k_1$-level controllable and another loop L2 is $k_2$-level observable. A dual point involves multiplexing the output of a $k_1$ level controllable EXU in loop L1 with either an input register (register-file based method) or the output (direct method) of a $k_2$ level observable EXU in loop L2. The dual point simultaneously enhances the observability of loop L1 to $k_2+1$ ($k_2$ for direct method), and the controllability of loop L2 to $k_1+1$ ($k_1$ for direct method).

Figure 6A:
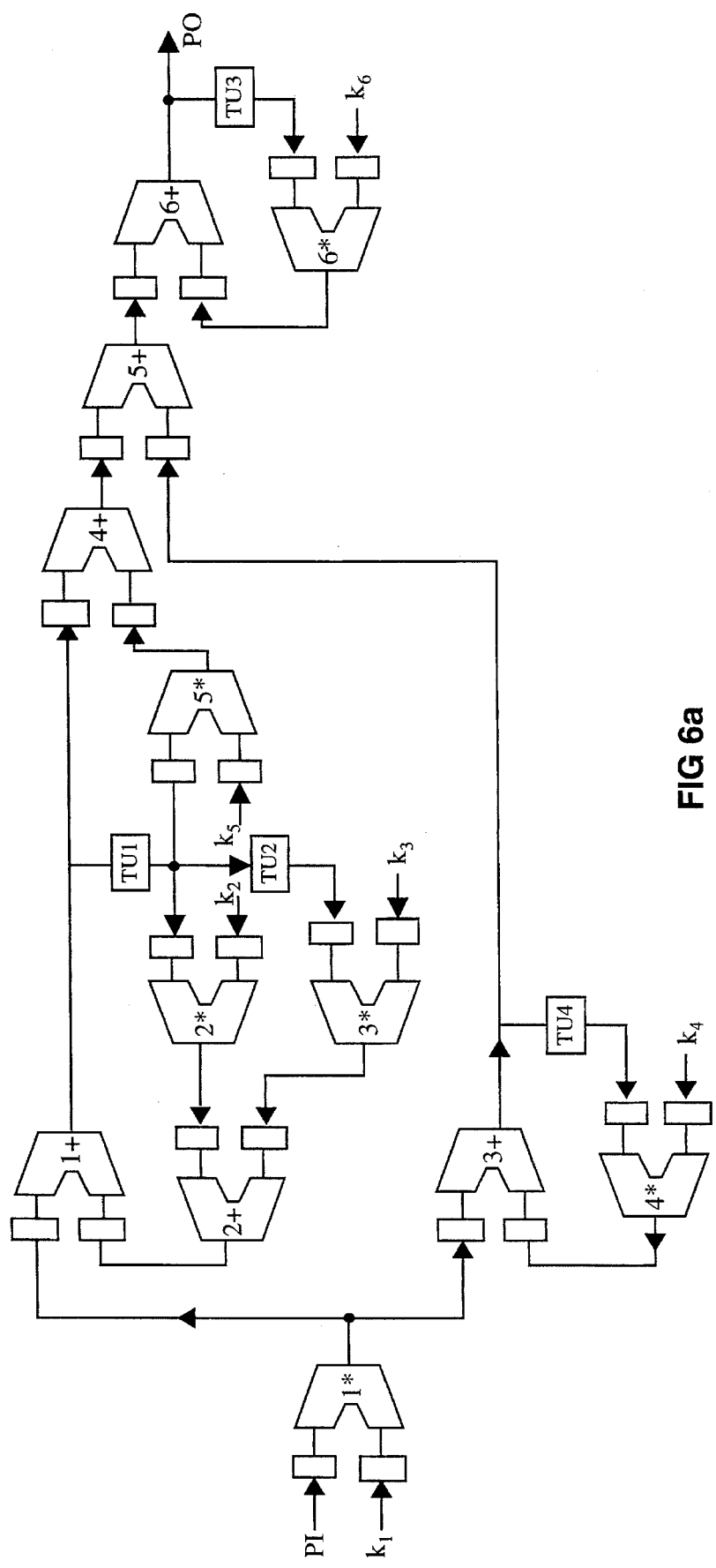
FIG. 6a is a RT-level data path diagram of a 4th order IIR parallel filter.
Figure 6B:
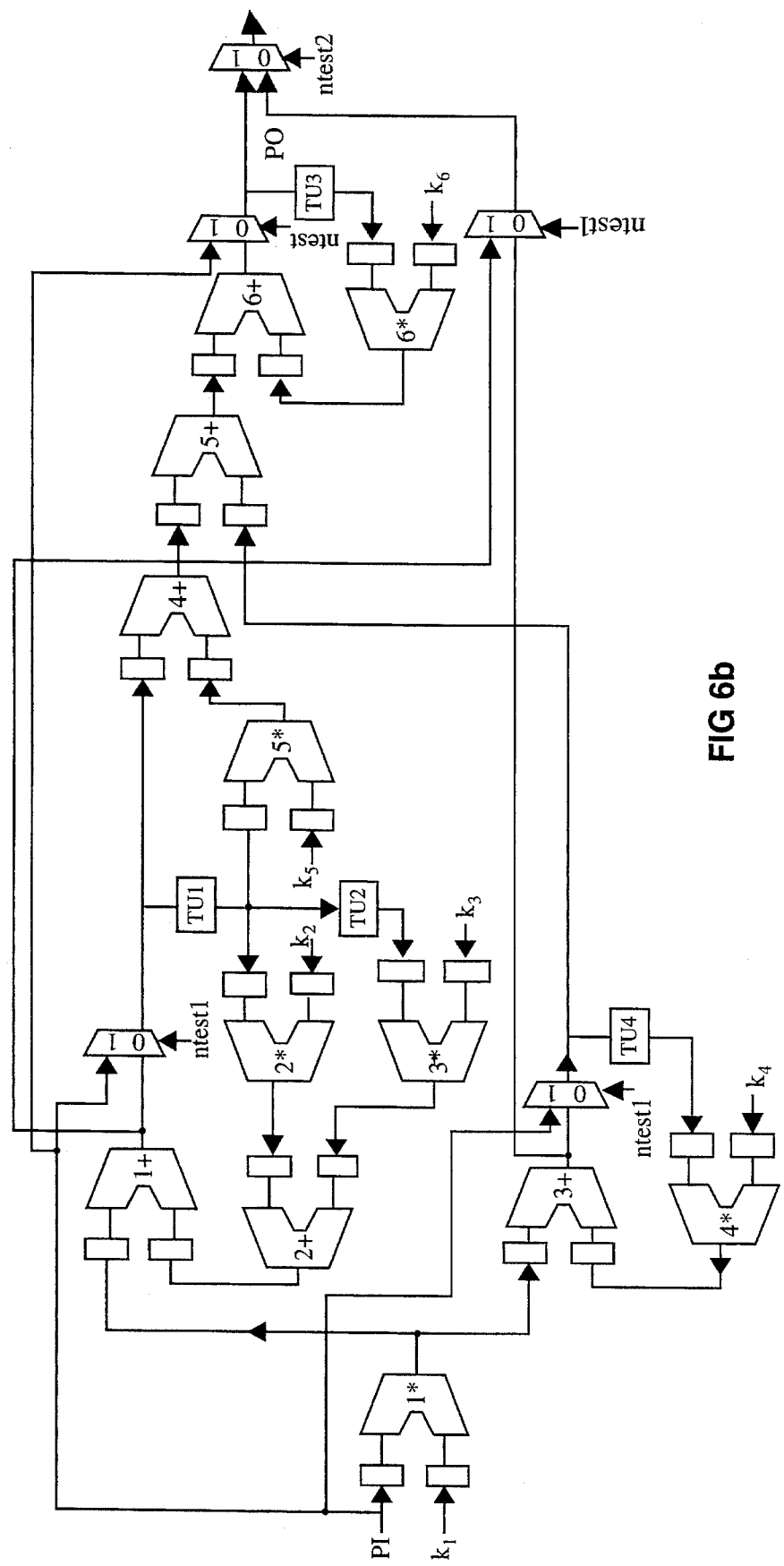
FIG. 6b is a RT-level data path diagram of the filter in FIG. 6a having 0-level testable design using three controllability points, two observability points and live interconnects.

The data path of a 4th order IIR parallel filter is shown in FIG. 6(a). The original data path is untestable, as shown by the results of running HITEC (row Orig) in Table 4. A non-scan 0-level testable design, using three controllability points and two observability points, is shown in FIG. 6(b). The test hardware added is shown with an associated ntest signal. The non-scan design has a very high test efficiency, as evidenced by the row 0-lev ill Table 4.

TABLE 4

| | 4IIRpar: Cost and Effect of several DFT schemes | | | | | | | | |
|---|---|---|---|---|---|---|---|---|---|
| | | Overhead | Faults | | | | | Tgen | Tappl |
| Type | Test Hardware | (Cells) | Total | Abt | FC % | TE % | Vec | (secs) | (cycles) |
| Orig Partial-Scan DFT | None | 0 | 14215 | 13646 | 0.00 | 4.00 | — | 77527 | -NA- |
| Opus LR Non-Scan DFT | 60 scan FFs 60 scan FFs | 665 665 | 14215 14215 | 5 3 | 96.80 96.82 | 99.96 99.97 | 98 108 | 913 399 | 5880 6480 |
| 3-lev | 2c, 2dp | 347 | 14497 | 145 | 95.90 | 98.99 | 151 | 13919 | 151 |
| 0-lev | 3cp, 2op | 565 | 14953 | 13 | 96.91 | 99.91 | 190 | 602 | 190 |

Examination of the data path in FIG. 6(a) reveals that the loops through the EXUs 1+, and 3+, can be made 1-level controllable, just by adding a constant 0 to the left register of 1+ and 3+ respectively. Also, the loop through 6+ is already 1-level observable. Hence, a more cost-effective non-scan design can be obtained using distributed controllability/observability points. To make the data path 1-level testable requires two constants, two observability points from 1+ and 3+ respectively, and one controllability point at the output of 6+.

Figure 6C:
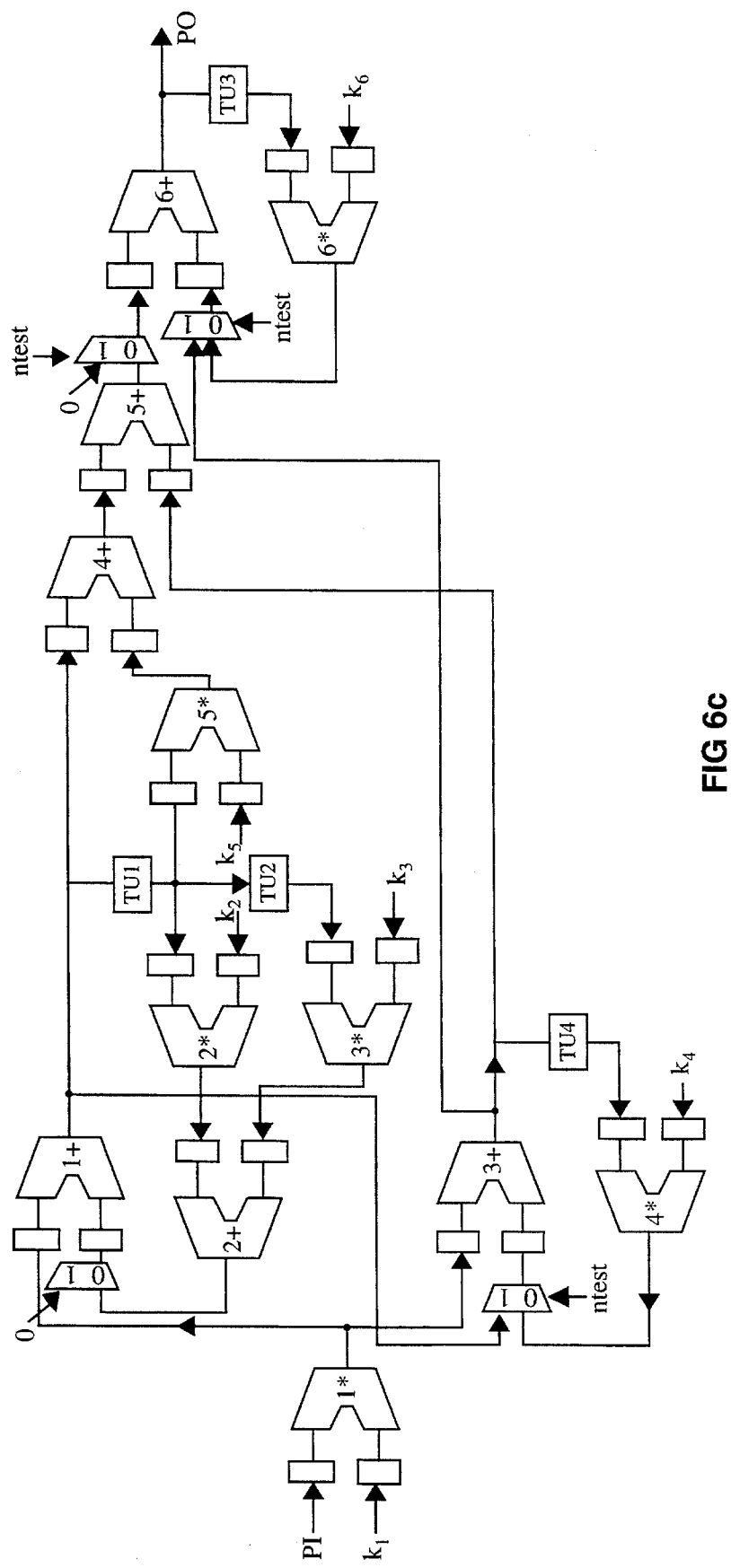
FIG. 6c is a RT-level data path diagram of the filter in FIG. 6a having 3-level testable design using two dual points, two constants and two interconnects.

However, using dual points reduces the test hardware requirement further. Adding a constant to the left register of 1+ makes all loops through 1+ 1-level controllable. A dual point added from 1+ to the left register of 3+, and another dual point added from 3+ to the right register of 6+ (with a constant added to the left register of 6+) makes the loops through 3+ 2-level controllable and 2-level observable, the loops through 1+ 3-level observable, and the loops through 6+ 3-level controllable. The resulting data path, shown in FIG. 6(c), is 3-level testable. The test hardware added is shown with the ntest signal. Note that the hardware overhead for a dual point is the same as that of a controllability or an observability point. Hence, the dual point solution is less expensive than the 0-level solution shown in FIG. 6(b), which employs controllability and observability points. In fact, the hardware overhead of the dual point solution (row 3-lev) is 40% less than the overhead of the 0-level solution, as shown in Table 4. Also, the dual point solution has a very high test efficiency, 99%, as shown in the row 3-lev in Table 4. The insertion of dual points can only make loops k-level controllable/observable, k> 0. Hence, non-scan DFT using dual points is effective only clue to the effectiveness of the k-level testability measure disclosed herein.

Having described the methods of applying non-scan design DFT of RT-level data paths, novel algorithms will be described which add the minimal hardware necessary to make all loops in the data path k-level controllable and k-level observable, for a user-specified value of k, using the non-scan DFT methods comprising the present invention. A first algorithm to be described uses distributed controllability and observability points. The algorithm is modified for using dual points to reduce the hardware overhead of the non-scan DFT approach. The minimum set of nodes whose breaking (that is, making the nodes 0-level controllable/ observable) results in all loops k-level controllable/observable is termed the k-level Minimum Feedback Vertex Set (MFVS). The special case is the (0-level) MFVS which has been used in several partial scan approaches to break all the loops directly that is, to make all loops 0-level controllable and observable. The general problem of finding the k-level MFVS is NP-Complete, as is illustrated by restricting the problem to the special case of 0-level MFVS which is known to be NP-complete. The non-scan DFT approaches (distributed test points and dual test points)result in both a heuristic and optimal implicit enumeration-based solution.

The principle of the following algorithm is to iteratively select controllability and observability points which will ensure that all loops are k-level observable and controllable, using the lowest hardware cost. Since addition of a controllability point (cp) or observability point (op) requires a new interconnect and a multiplexor, it is always preferable to add constants as a means of enhancing observability and controllability rather than to add either a cp or an op. Note the number of loops in an EXU S-graph can be exponential, so it is not possible to enumerate them individually. Instead, at each step of the algorithm, a count is made of the number of nodes in all loops (strongly connected components) which either have the level of controllability or the level of observability higher than required. Finally, note that all nodes in the EXU S-graph have to be considered for addition of cp or op, not only the nodes in strongly connected components, as is the case when a conventional minimum feedback vertex set is to be found.

The input to the algorithm is the target datapath, and the maximum number of allowed cp or op specified by the user. The following pseudo code summarizes the preferred heuristic algorithm used. A test point, p, refers to either a controllability point or an observability point.

```
add_test_points()

1.  while (there exists a loop controllability/observability
        level > k
2.      if (there is still an available point) {
3.          for each vertex in S-graph
4.              E(p) ← evaluate test point (p), ∀ test points;
5.          select test point with highest E(p);
6.          add best test point;
        }
7.      else if (there exists a register files without a constant) {
8.          for each vertex
9.              E(p) ← evaluate constant(p);
10.         select constant with highest E(p);
11.         add best constant;
        }
12.     else { request more test points; EXIT; }
13.     update_the_number_of_nodes_in_remaining_SSC();
14. }
```

Both test points and constants are evaluated according to the following objective function E(p), where p is the test point or the constant being evaluated.

$$E(p)=\Delta(LCM(p))+\Delta(LOM(p))$$

The LCM (Loop Controllability Measure) cost is equal to the number of nodes which are in loops whose controllability level is greater than k. Similarly, the LOM (loop observability measure) cost is equal to the number of nodes which are in loops whose observability level is greater than k. Both measures are calculated by using the equations for clevel(M) above, consecutive identification of remaining strongly connect components (SCC), and counting the number of nodes in the SCCs. The symbol $\Delta$ denotes the change in the LCM and LOM cost due to insertion of the candidate test point or constant.

In order to minimize hardware overhead using dual points, it is necessary to modify algorithm add test points(). In step 4 of each iteration, instead of evaluating the test points, candidate dual points are evaluated. All pairs of nodes u,v in the EXU S-graph are considered, such that both u and v belong to a SCC in order to be candidate dual points. This is possible, because unlike the FF S-graph at the gate level, an EXU S-graph at the RT-level has very few nodes, as reflected by the Table 5.

TABLE 5

| | The different S-Graphs of the data paths | | | | | |
|---|---|---|---|---|---|---|
| | FF S-graph | | REG S-graph | | EXU S-graph | |
| Design | Nodes | MFVS | Nodes | MFVS | Nodes | MFVS |
| 4IIRcas | 220 | 60 | 11 | 3 | 9 | 2 |
| Speech | 220 | 20 | 11 | 1 | 9 | 1 |
| EWF | 368 | 240 | 23 | 15 | 6 | 3 |
| EWFhigh | 360 | 280 | 18 | 14 | 2 | 1 |
| 4IIRpar | 440 | 60 | 22 | 3 | 16 | 3 |

Simulations were performed on the data paths for 4th order IIR cascade filter, speech filter, 5th order elliptical wave digital filter synthesized using high hardware sharing and 4th order IIR parallel filter synthesized using no hardware sharing. Comparisons were also conducted using several partial scan designs using OPUS and Lee-Reddy's tools and the non-scan DFT methods comprising the present invention.

The results of the tests showed that the k-level controllable/observable loops measure is effective in non-scan DFT to make data paths highly testable. Moreover, the results show that it is not necessary to make all loops directly (0-level) controllable/observable in order to achieve high test efficiency. Most significantly, the results show the feasibility of producing non-scan testable data paths, which are testable at-speed, with only marginal area overhead and which require less test application time than the time required for scan design.

While the invention is described in connection with data paths, it will be apparent to those skilled in the art, that the invention is applicable to any design which uses execution units and registers.

After determining in accordance with the teachings of the present invention the modifications to the circuit which are required for non-scan testing, the circuit is synthesized in a conventional manner. The resultant synthesized circuit both performs the required operational functionality and permits non-scan at speed testing of the circuit.

While there has been described and illustrated methods for non-scan design-for-testability of RT-level data paths circuit designs, it will be apparent to those skilled in the art that variations and modifications are possible without deviating from the spirit and broad principles of the present invention which shall be limited solely by the scope of the claims appended hereto.

What is claimed is:

1. A method of non-scan design-for-testability of circuits comprising the steps of:

defining a circuit to be synthesized functionally in terms of a register-transfer level data path;

modifying the register-transfer level data path by adding observable points and controllable points to render the circuit to be k-level controllable and/or observable; and synthesizing the circuit including the modifications to enable the circuit to be tested at-speed.

2. A method of non-scan design-for-testability of circuits as set forth in claim 1 where said modifying the register-transfer level data path comprises a direct non-scan method.

3. A method of non-scan design-for-testability of circuits as set forth in claim 1 where said modifying the register-transfer level data path comprises a register-file based non-scan method.

4. A method of non-scan design-for-testability of circuits as set forth in claim 1 where said modifying the register-transfer level data path comprises making loops in the register-transfer level data path k-level controllable/observable.

5. A method of non-scan design-for-testability of circuits as set forth in claim 4 where said making loops k-level controllable/observable includes performing algorithm add_test_points() to minimize hardware costs.

6. A method of non-scan design-for-testability of circuits as set forth in claim 5 where said performing algorithm add test points() uses dual points.

7. A method of non-scan design-for-testability of circuits as set forth in claim 4 where the values of k for k-level controllable and k-level observable are different.

8. A method of non-scan design-for-testability of circuits comprising the steps of:

defining a circuit to be synthesized functionally in terms of a register-transfer level data path;

modifying the register-transfer level data path by adding constants for providing observable points and controllable points to render the circuit to be k-level controllable and/or observable; and synthesizing the circuit including the modifications to enable the circuit to be tested at-speed.

9. A method of non-scan design-for-testability of circuits as set forth in claim 8 where said modifying the register-transfer level data path comprises a direct non-scan method.

10. A method of non-scan design-for-testability of circuits as set forth in claim 8 where said modifying the register-transfer level data path comprises a register-file based non-scan method.

11. Method of non-scan design-for-testability of circuits as set forth in claim 8 where said modifying the register-transfer level data path comprises making loops in the register-transfer level data path k-level controllable/observable.

12. A method of non-scan design-for-testability of circuits as set forth in claim 11 where said making loops k-level controllable/observable includes performing algorithm add_test_points() to minimize hardware costs.

13. A method of non-scan design-for-testability of circuits as set forth in claim 12 where said performing algorithm add_test_points() uses dual points.

14. A method of non-scan design-for-testability of circuits as set forth in claim 11 where the values of k for k-level controllable, and k-level observable are different.

* * * * *